United States Patent [19]

Simonson et al.

[11] Patent Number: 4,933,782
[45] Date of Patent: Jun. 12, 1990

[54] DIGITAL PHASE LOCK DEVICE

[75] Inventors: Patricia A. Simonson; Timothy S. Koepp, both of San Jose, Calif.

[73] Assignee: Amdahl Corporation, Sunnyvale, Calif.

[21] Appl. No.: 178,355

[22] Filed: Apr. 6, 1988

[51] Int. Cl.$^5$ .............................................. G11B 5/09
[52] U.S. Cl. ...................................................... 360/51
[58] Field of Search .................. 360/51; 378/120, 81; 331/1 A; 328/155

[56] References Cited

U.S. PATENT DOCUMENTS

| 4,424,536 | 1/1984 | Hashimoto et al. | 360/51 |
| 4,520,408 | 5/1985 | Velasquez | 360/51 |
| 4,780,772 | 10/1988 | Shibuya et al. | 360/51 |
| 4,809,088 | 2/1989 | Lotgren et al. | 360/51 |
| 4,829,545 | 5/1989 | Guzik et al. | 360/51 |

*Primary Examiner*—Vincent P. Canney
*Attorney, Agent, or Firm*—Fliesler, Dubb, Meyer & Lovejoy

[57] ABSTRACT

Described is a digital phase lock device comprising a feedback loop having a plurality of delay elements and a selector. The delay elements delay a sampling signal into signals having different time delay values relative to the sampling signal. These delay signals are compared with a periodic target signal whereby one of them is selected as the next sampling signal. As a result, the sampling signal tracks the periodic signal.

15 Claims, 4 Drawing Sheets

1

DIGITAL PHASE LOCK DEVICE

TECHNICAL FIELD

This invention relates to a digital phase lock device.

BACKGROUND OF THE INVENTION

Phase lock devices are most commonly used for synchronizing a system to an incoming periodic signal, frequently in connection with inter-system communication where proper interpretation of the communicated signals depends upon their being read within defined timing windows. A phase lock device provides the synchronization by generating a periodic signal which tracks the timing windows of the incoming signal.

A discussion on conventional phase lock devices can be found in "Analysis And Design Of Analog Integrated Circuits" by P. R. Gray et al, John Wiley & Sons, 1977. Basically, a phase lock device comprises a phase comparator, a low pass filter and a voltage controlled oscillator (VCO). The VCO generates a periodic signal whose frequency is adjustable by an externally applied voltage. In tracking a target signal, the VCO output signal is compared with the target signal to produce an error voltage that reflects their phase difference. This error voltage is fed back, via the low pass filter, to the VCO to adjust its output signal so that its phase matches the phase of the target signal.

The periodic signal of a conventional phase lock device is typically generated by a resistor-capacitor type multivibrator. It has a free-running frequency, which is typically the frequency of the VCO in unlocked state. The tracking capability of a phase lock device is usually limited to a frequency range (commonly referred to as the "lock range") surrounding the free-running frequency.

When used to track an incoming signal, it is desirable to tune the free-running frequency of the VCO to the nominal frequency of the incoming signal, so that all deviations of the incoming signal from the nominal frequency may fall within the lock range of the phase lock device.

Unfortunately, tuning a VCO is usually time consuming. This is compounded by the fact that divergence in intrinsic characteristics of its components most frequently necessitate individual tuning of a VCO. Worse yet, temperature sensitivity and age-related performance degradation of the components frequently necessitate a retuning of a VCO.

As a result, there is a need for a digital phase lock device which can be tuned easily. It is further desirable to have a phase lock device that can be tuned under program control.

SUMMARY OF THE INVENTION

In accordance with the present invention, a digital phase lock device is provided for tracking an incoming periodic signal. The device comprises a feedback loop having means responsive to a first signal for producing a plurality of second signals having different delay values relative to said first signal; and selector means comparing said incoming digital signal with said second signals for selecting one of said second signals to become said first signal.

Advantageously, the feedback arrangement of the digital phase lock device generates a period signal whose free running frequency can be adjusted to match the frequency of the incoming digital signal. Moreover, the phase lock device according to the present invention can be tuned simply by adjusting the respective delay values.

DETAILED DESCRIPTION

Figure 1:
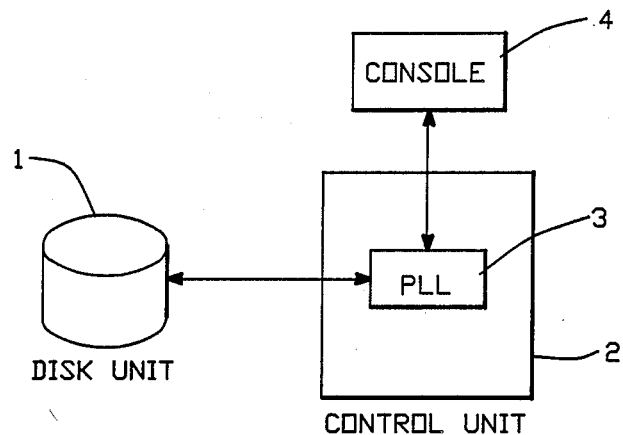
FIG. 1 is a block diagram of a disk storage system which embodies the present invention.

Referring to the block diagram of FIG. 1, there is shown a disk storage subsystem comprising a disk unit 1 and a control unit 2 each being clocked individually. Information stored in disk unit 1 is sent, during data retrieval, to the control unit 2 in form of digitized signals. The signals are then decoded before they are sent to a requesting processing unit (not shown).

Upon entering control unit 2, digitized signals sent by disk unit 1 pass through a digital phase lock device 3, implemented in accordance with the present invention, so that proper timing windows can be generated for decoding the signals.

According to a preferred embodiment of the present invention, digital phase lock device 3 is connected to an external unit (also referred to as a console) 4 from which the free running frequency of the phase lock device 3 is adjusted, as will be described in more detail herein below.

Figure 5:
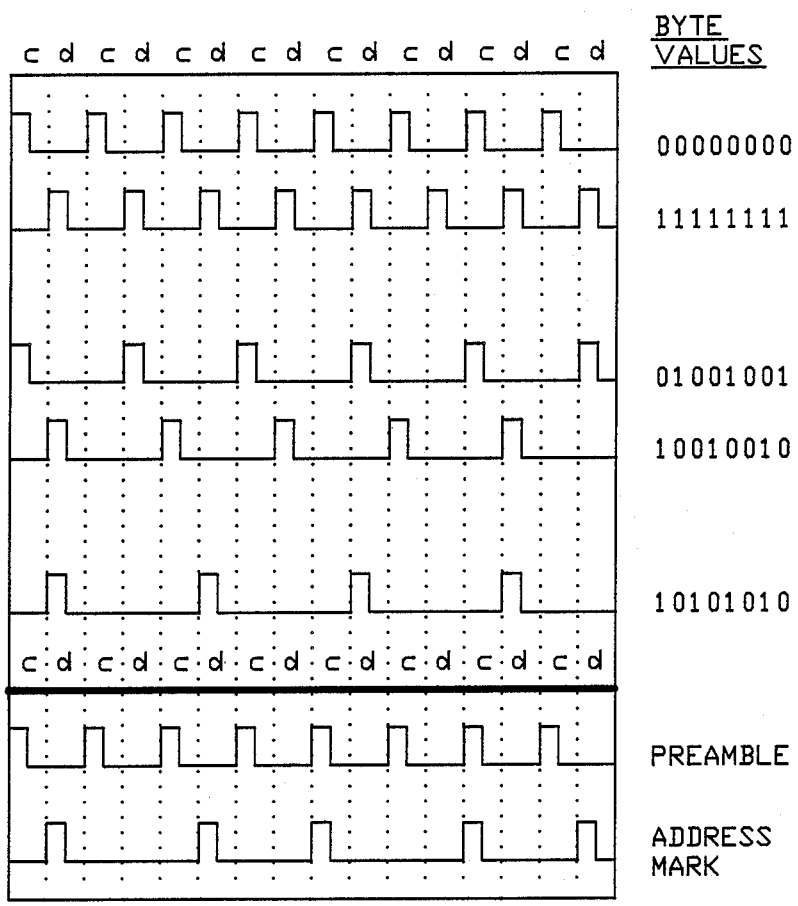
FIG. 5 gives the coding definition under the Modified Frequency Modulation method.

In the preferred embodiment of this invention, data stored in the disk is recorded with the commonly known Modified Frequency Modulation (MFM) method (also known as the (1,3) code). According to the MFM method, each data bit is represented by two (2) cells, a clock cell and a data cell. A binary "1" data bit is encoded as a "0" in the clock cell and a "1" in the data cell. A binary "0" data bit is coded as a "1" in the clock cell and a "0" in the data cell, except when a binary "1" data bit is followed by a binary "0" data bit, in which case the binary "0" data bit is represented by a "0" in the clock cell as well as a "0" in the data cell (this is referred to as the "no pulse" case). MFM also requires a minimum of one "0" cell between two "1" cells in the recorded data and allows a maximum of only three consecutive "0" cells in the recorded data. Coding definition under the MFM method is illustrated in FIG. 5.

Figure 2:
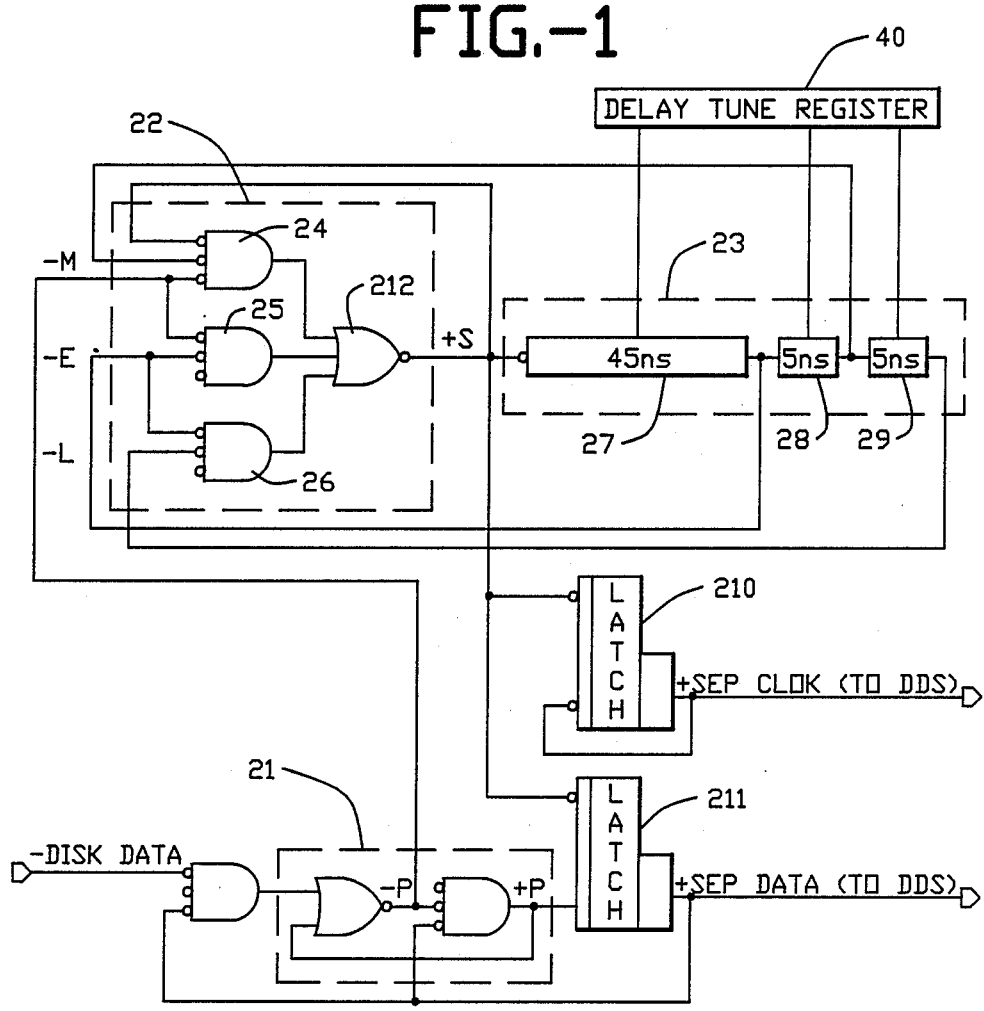
FIG. 2 is a schematic diagram showing one implementation of the phase lock device for use in the disk storage system.

FIG. 2 illustrates one implementation of the digital phase lock device 3 as used in the aforementioned disk storage system. Delay block 23 includes a first delay 27, a second delay 28 and a third delay 29 serially connected. Delay block 23 receives a first signal (also called a sampling signal) +S from which it generates a plurality of second signals, including an early (−E), a medium (−M), and a late (−L) signal, each of which has a logic level opposite to +S. When the sampling signal ts is locked onto a target signal, −M is gated to become the next sampling signal +S. When the target signal is ahead of the sampling signal +S, −E will be used to move +S forward. When the target signal lags behind the sampling signal +S, −L will be used to delay +S.

Each of these second signals −E, −L, and −M, has a different time delay value relative to signal +S. In an illustrative embodiment of the present invention, signal −E lags +S by forty-five nanoseconds (ns), signal −M lags +S by fifty ns, and signal −L lags +S by fifty-five ns. The respective delays are provided in one implementation by, respectively, adding a forty-five ns gate delay 27 to +S to form −E, adding a five ns gate delay 28 to −E to form −M, and adding a five ns gate delay 29 to −M to form −L. It should be obvious to one skilled in the art that other implementations are also possible, including using three separate delay blocks with different delay values connected in parallel to receive signal +S.

Signals −E, −M, and −L, are received by selector block 22 whereby one of them is selected to become the next sampling signal +S. It should easily be understood that delay block 23 and selector block 22 combine to form a feedback loop. It can also be understood easily that ts is a periodic signal produced by the feedback loop.

The disk data pulse signals are received and gated by an AND-gate 212. These signals are latched in latch block 21. A negative phase, −P, of the latched signal from latch block 21 is used for making the selection.

The selection of a signal from −E, −M, and −L to become signal +S is performed by the selection block 22 based upon comparison of signals −E, −M, and −L with the disk data pulse signals. Selector block 22 according to the illustrative embodiment comprises three AND-gates 24, 25 and 26 and a NOR gate 212. AND-gate 24 has at least a first inverse input receiving the +S signal, a second inverse input receiving the −M signal from the delay block 23 and a third inverse input receiving the disk data pulse −P. AND-gate 25 has at least a first inverse input receiving the disk data pulse −P and at least a second inverse input receiving the −E signal from the delay block 23. AND-gate 26 has at least a first inverse input receiving the −E signal from delay block 23 and a second inverse input receiving the −L signal from delay block 23. The respective outputs of AND-gates 24, 25, and 26 are connected to the inputs of NOR gate 212. Accordingly, the selector block provides the following logic relation:

$$-S_{n+1} = (-S_n \text{ AND } P \text{ AND } M) \text{ OR } (P \text{ AND } E) \text{ OR } (E \text{ AND } L)$$

Figure 3:
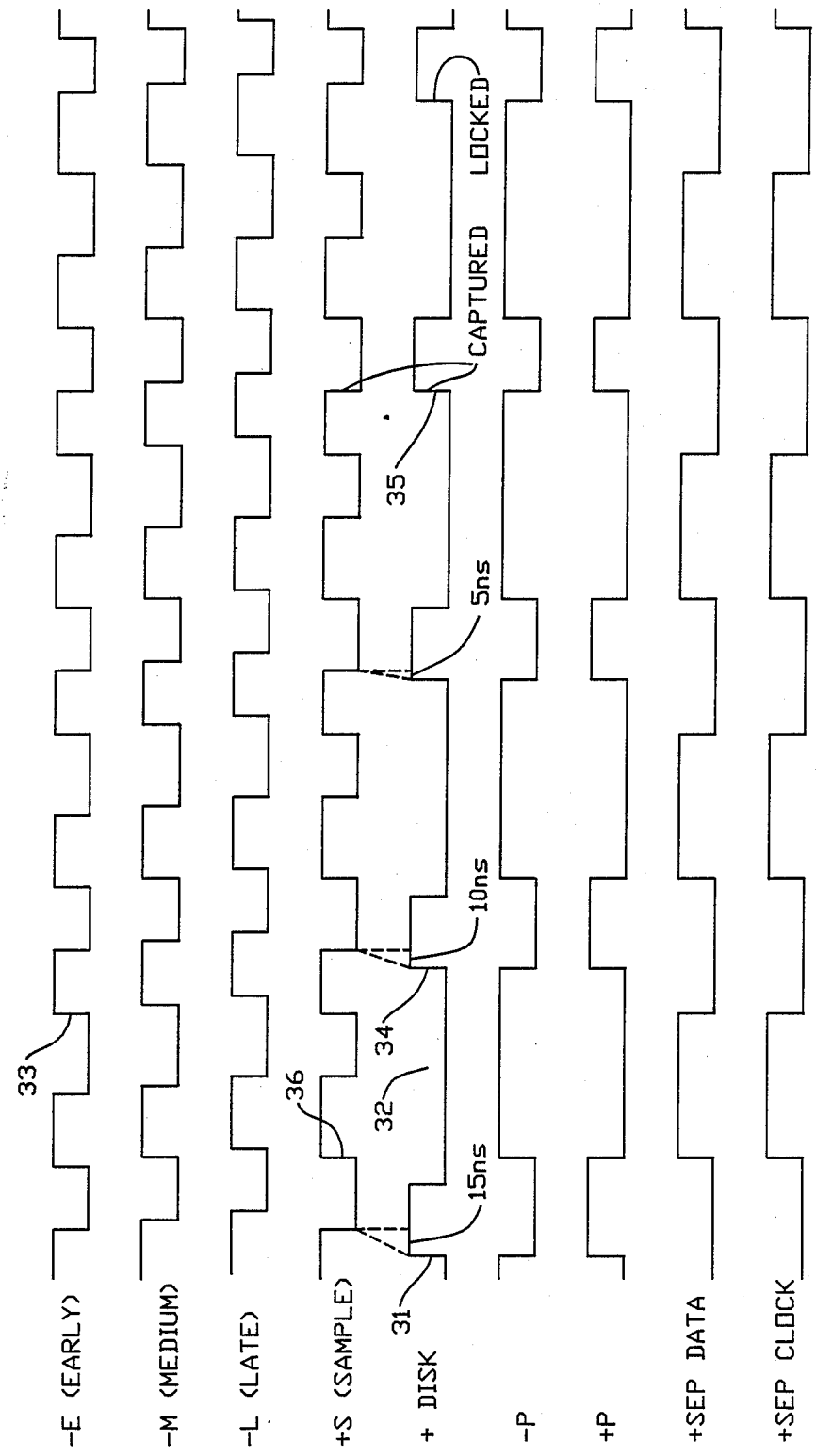
FIG. 3 is a timing diagram illustrating the operation of the phase lock device shown in FIG. 2.

With reference to the timing diagram of FIG. 3, if a disk data pulse arrives early with respect to +S, phase lock device 3 will respond with −E. When the disk data pulse falls with the window between −E and −L, phase lock device 3 will respond immediately. When the disk data pulse is late, or when there is no disk data pulse, phase lock device 3 will respond with −L. In the no pulse case, −E is selected after −L, allowing +S to start sampling without correction.

As will be discussed hereinafter, the above described adjustment will cause the sampling signal +S to track the disk data pulse.

+S is used to clock disk data pulses into latch 211. +S is also loaded into Latch 210 to produce clock signals derived from the disk data pulses.

The feedback from latch 211 to the AND-gate 212 is used in the present embodiment to ensure that the input data stream does not have two consecutive "1"s, in accordance with the MFM coding definition. Latch block 21 is reset by the feedback path from latch 210, making use of the fact that no two consecutive "1"s can occur in the disk data stream.

A more detailed description of the timing diagram of FIG. 3 is now given to further facilitate the understanding of the phase lock device. In this description, an assumption is made that the disk data signal has a period of two hundred ns, and that each cell is one hundred ns long.

Assume, by way of example, that the sampling signal (+S) lags the disk data pulse (+DISK) by fifteen ns at the start of the data communication (point 31). When the early signal −E arrives at the selection block, −P is already active, the early signal −E is therefore gated by AND-gate 25. When this gated signal returns to the selector block 22 by way of the delay block 23, the −M signal is gated by block 24 (point 36). As a result, the sampling signal +S is moved ahead five ns.

At point 32, there is no data pulse from the disk, signal +S is generated from gate 26 when both pulses −L and −E arrive. When −E becomes inactive and gate 26 is thereby disabled, +S signal will change level with no correction.

When the next disk data pulse arrives at point 34 (it can be seen that at point 34, an adjustment of five ns has already been made to the sampling signal +S), −E is gated by AND-gate 25. Again, when this gated signal returns to the selector block 22 via the delay block 23, the −M signal is gated by block 24, thus moving the sampling signal +S another five ns ahead.

At each disk data pulse time, phase lock device 3 makes a five ns adjustment until at point 35 when it captures the disk data signal. From then on, the sampling signal +S will be locked onto the disk data pulse signals.

Figure 4:
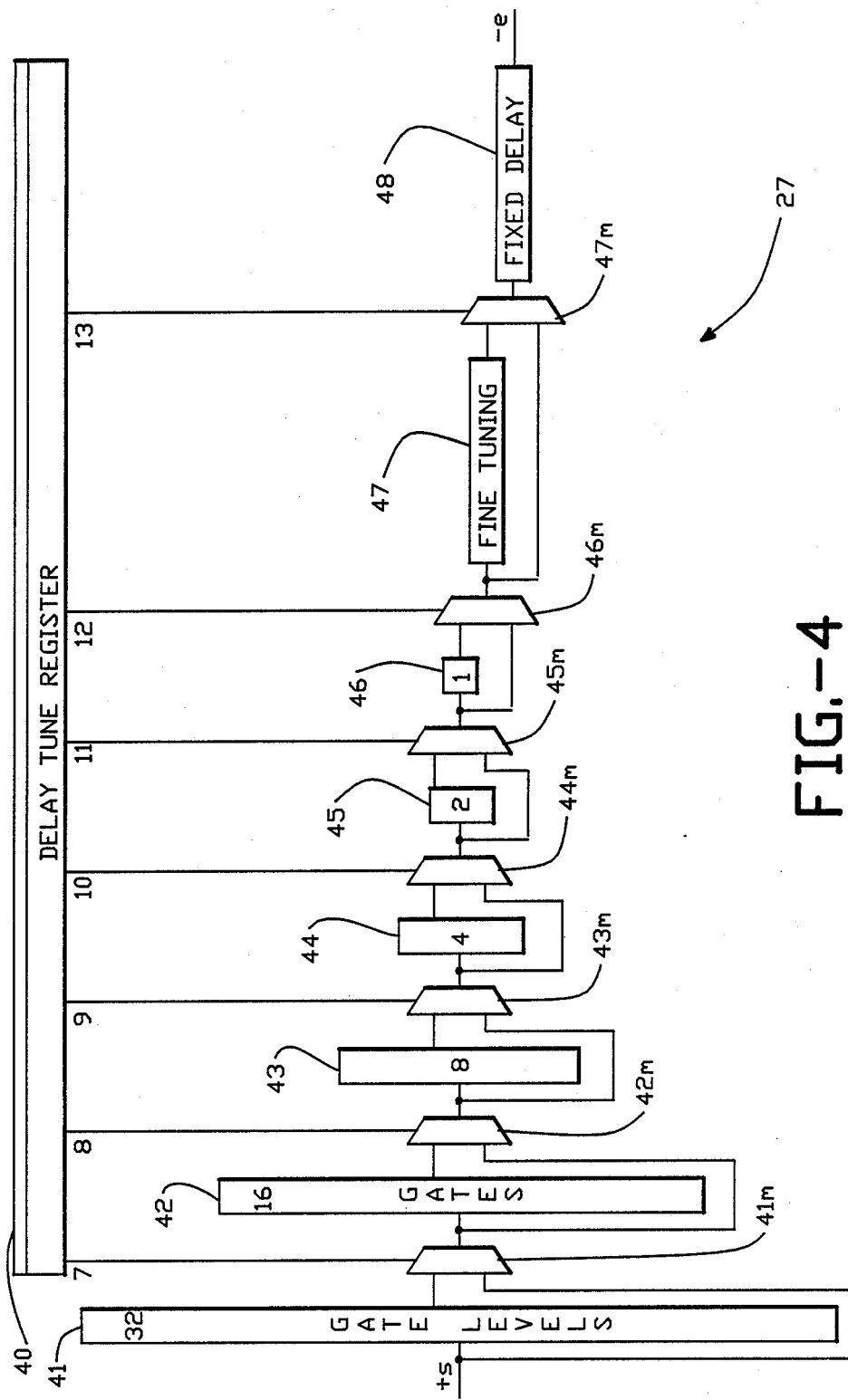
FIG. 4 illustrates an implementation whereby the frequency of the phase lock device can be tuned.

FIG. 4 illustrates a phase lock device 3 having means for tuning its free running frequency. By way of example, delay 27 as shown in FIG. 4 comprises a plurality of gates 41–47 connected in series. Each of these gates can be bypassed by setting the selection control of a corresponding multiplexer 41m–47m. The selection controls of the multiplexers are connected to a register 40. By setting specific value in this register, the value of each of −E, −M and −L can be adjusted.

In one implementation of this invention, the register 40 is connected to a console 4 that monitors and controls the disk system. Accordingly, register 40 can be set by microcode executing in console 4.

In tuning the phase lock device, the delay of the loop formed by blocks 22 and 23 is measured by counting bytes of data pulses from the disk. In accordance with conventional disk recording practice, the disk drive issues an index pulse at each revolution of the disk. This pulse is used as a reference for timing (byte counting) the delay loop.

Timing the delay loop is accomplished by counting the number of data bytes between the rising edges of two index pulses. This gives the actual number of data bytes that would fit on one track based upon the current delay value and loop selected. The sampling signal +S substitutes for the actual disks data. The number of data bytes are counted using the number of sampling signals +S instead of the disk data pulses. The expected number of bytes is compared with the actual number, the delay value is increased or decreased until a value is found that produces the actual number of bytes closest to the expected number of bytes. The three delay taps as shown in FIG. 2 are selected individually in tune mode so that each delay chain can be timed and tuned.

The expected number of data bytes that would fit on one track of the disk is used as the target value. Since the time for one disk revolution is constant and E, M, L are not, each of these delay taps will require a different target value. The formula used to calculate the target values for E, M, L is:

$$\text{target bytes/rev} = \frac{\text{disk speed}/(N*10^{-9} \text{ sec/osc})}{(4\text{osc/bit})(8 \text{ bits/bytes})}$$

where N=45 for E, 50 for M, and 55 for L for the illustrative embodiment.

A typical tuning algorithm for the implementation shown in FIG. 4 is:

(a) Find the tuning value that matches E's chain delay to E's target, using only the 32, 16, 8, 4 and 2 components of the chain. This gives the coarse tune value;

(b) Using the coarse tune value, fine tune by using the 1 gate level and the fine tune components of the E chain. This gives the tune value;

(c) Using this tune value, find the tuning value that matches M's chain delay to M's target using the 8, 4, 2 and 1 components of the M chain. This becomes the new tune value for use in finding the L's tune value;

(d) Using this new tune value, find the L tuning value that matches L's chain delay to L's target using a given set of components of the L's chain. This will become the final value used by the digital phase lock device.

This above-described specific embodiment has clearly demonstrated a simple but efficient device for tracking digital periodic signals. Moreover, it has also been shown that the free-running frequency of the device can be tuned easily to match the nominal frequency of a target signal.

While the invention has been particularly shown and described with reference to preferred embodiments thereof, it will be understood by those skilled in the art that the foregoing and other changes in form and details may be made therein without departing from the spirit and scope of the invention.

We claim:

1. A digital phase lock device comprising:
   means for receiving a periodic digital incoming signal; and
   oscillator means coupled to said receiving means for generating a periodic digital sampling signal with a predetermined frequency, including delay means for varying said predetermined frequency and means responsive to said incoming signal for adjusting said delay means to lock said sampling signal to said incoming signal.

2. A digital phase lock device as in claim 1 wherein said oscillator means comprises a feedback circuit comprising:
   delay means responsive to a first signal for producing a plurality of second signals having different delay values relative to said first signal; and
   selector means coupled to said delay means and responsive to said incoming signal for selecting one of said second signals to said delay means as said first signal.

3. A digital phase lock device comprising:
   first means having at least one delay means and responsive to a first signal for producing a plurality of second signals having different delay values with respect to said first signal;
   selector means coupled to said first means and responsive to a digital incoming signal for gating one of said plurality of second signals to said first means as said first signal; and
   programmable means coupled to said first means for adjusting the delay values of said delay means.

4. A phase lock device as in claim 3, wherein said delay means comprises a plurality of transistor gates.

5. A phase lock device as in claim 4, wherein said programmable means includes to a multiplexer means having a selection control coupled to said transistor gates.

6. A phase lock device as in claim 5, including a programmable register coupled to said multiplexer for setting said selection control.

7. A phase lock device as in claim 6, wherein said register is coupled to a data processor system.

8. A method for tracking an incoming digital signal, comprising the steps of:
   circulating a digital sampling signal through a feedback circuit having at least one adjustable delay;
   comparing said sampling signal with said incoming digital signal; and
   responsive to said comparison, adjusting said delay so that said incoming digital signal locks onto said sampling signal.

9. A method as in claim 8 wherein said adjusting step comprises the steps of:
   producing a plurality of delayed signals from a first signal, said delayed signals having different delay values relative to said sampling signal; and
   responsive to said comparison, selecting one of said delayed signals to become said first signal.

10. A digital phase lock device for tracking a periodic data signal from an external information storage unit, comprising:
    first means for receiving said data signal; and
    an oscillator circuit coupled to said first means for generating a periodic signal having a nominal frequency, comprising:
    a plurality of delays receiving a first signal for releasing a plurality of second signals having different delay values with respect to said first signal;
    a selector comparing said second signals and said data signal, and responsive to said comparison for selecting one of said second signals as said first signal so that said first signal matches said data signal.

11. A digital phase lock device for tracking a periodic data signal from an external information storage unit, comprising:
    first means for receiving said data signal; and
    an oscillator circuit coupled to said first means for generating a periodic signal having a nominal frequency, comprising:
    a plurality of delays receiving a first signal for releasing a plurality of second signals having different delay values with respect to said first signal, each of said delays comprises a plurality of transistor gates coupled to a multiplexer means;
    a selector comparing said second signals and said data signal, and responsive to said comparison for selecting one of said second signals as said first signal so that said first signal matches said data signal.

12. A phase lock device as in claim 11, comprising a programmable register coupled to said multiplexer for setting selecting a subset of said transistor gates to change the value of the delay.

13. A phase lock device as in claim 12, wherein said register is set by a data processor system.

14. A phase lock device as in claim 11, wherein said storage unit records data using a modified frequency modulation method.

15. A digital phase lock device comprising:

means for receiving a periodic digital incoming P signal; and oscillator means coupled to said receiving means for providing a sampling signal S tracking said incoming signal, comprising:

delay means receiving said sampling signal for providing a plurality of delayed signals of said sampling signal, including an early signal E, a medium signal M, and a late signal L; and selecting means coupled to said delay means and said receiving means for selecting one of said delayed signals as said sampling signal, said selection having a logic relation:

$$-S_{n+1} = (-S_n \text{ AND P AND M}) \text{ OR (P AND E) OR (E AND M)}.$$

* * * * *